(12) United States Patent
Fangyuan (10) Patent No.: US 10,964,540 B2
(45) Date of Patent: Mar. 30, 2021

(54) SEMICONDUCTOR STRUCTURE FORMING METHOD

(71) Applicants: Semiconductor Manufacturing International (Beijing) Corporation, Beijing (CN); Semiconductor Manufacturing International (Shanghai) Corporation, Shanghai (CN)

(72) Inventor: Xiao Fangyuan, Shanghai (CN)

(73) Assignees: Semiconductor Manufacturing (Beijing) International Corporation, Beijing (CN); Semiconductor Manufacturing (Shanghai) International Corporation, Shanghai (CN)

( * ) Notice: Subject to any disclaimer, the term of this patent is extended or adjusted under 35 U.S.C. 154(b) by 0 days.

(21) Appl. No.: 16/659,909

(22) Filed: Oct. 22, 2019

(65) Prior Publication Data

US 2020/0279734 A1 Sep. 3, 2020

(30) Foreign Application Priority Data

Feb. 28, 2019 (CN) .......................... 201910152039.8

(51) Int. Cl.
*H01L 21/311* (2006.01)
*H01L 21/033* (2006.01)
(Continued)

(52) U.S. Cl.
CPC ...... *H01L 21/0337* (2013.01); *H01L 21/0276* (2013.01); *H01L 21/0332* (2013.01); *H01L 21/31144* (2013.01); *H01L 21/76816* (2013.01)

(58) Field of Classification Search
CPC ......... H01L 21/31144; H01L 21/31116; H01L 21/3086
See application file for complete search history.

(56) References Cited

U.S. PATENT DOCUMENTS

| 2011/0001108 A1* | 1/2011 | Greene | ................. | H01L 45/141 |
| | | | | 257/2 |
| 2014/0051247 A1* | 2/2014 | Cheng | ................. | H01L 21/0337 |
| | | | | 438/689 |

(Continued)

*Primary Examiner* — Thomas T Pham
(74) *Attorney, Agent, or Firm* — Brinks Gilson & Lione (57) ABSTRACT

The present disclosure provides a semiconductor structure forming method, including: providing a base, a first mask layer and a second mask layer located at the top of the first mask layer being formed on the base, and the second mask layer internally having a first opening, a second opening and a third opening; forming first side wall layers on a side wall of the first opening, a side wall of the second opening and a side wall of the third opening; forming a first pattern layer filling the first opening, the second opening and the third opening, the first pattern layer internally having a first groove; etching to remove the second mask layer located between the second opening and the third opening along the bottom of the first groove, so as to form fourth openings located between adjacent first side wall layers; and by using the second mask layer and the first side wall layers as masks, etching the first mask layer below the first opening, the second opening, the third opening and the fourth openings, so as to form a patterned first mask layer. The present disclosure can enlarge a process window and improve the position accuracy of the formed patterned first mask layer.

18 Claims, 9 Drawing Sheets

(51) Int. Cl.
*H01L 21/027* (2006.01)
*H01L 21/768* (2006.01)

(56) References Cited

U.S. PATENT DOCUMENTS

| | | | |
|---|---|---|---|
| 2014/0346677 A1* | 11/2014 | Sonoda | H01L 21/0337 257/774 |
| 2015/0111362 A1* | 4/2015 | Shieh | H01L 21/823431 438/424 |
| 2015/0147867 A1* | 5/2015 | Shieh | H01L 21/823431 438/424 |
| 2015/0147882 A1* | 5/2015 | Yao | H01L 21/76805 438/675 |
| 2015/0243519 A1* | 8/2015 | Devilliers | H01L 21/0228 438/692 |
| 2016/0049307 A1* | 2/2016 | Chen | H01L 21/0337 438/696 |
| 2016/0064248 A1* | 3/2016 | Lee | H01L 21/76816 438/637 |
| 2016/0276164 A1* | 9/2016 | Chang | H01L 21/0337 |
| 2020/0111677 A1* | 4/2020 | Srivastava | H01L 21/76895 |

* cited by examiner

SEMICONDUCTOR STRUCTURE FORMING METHOD

RELATED APPLICATIONS

The present application claims priority to Chinese Patent Appln. No. 201910152039.8, filed Feb. 28, 2019, the entire disclosure of which is hereby incorporated by reference.

BACKGROUND

Technical Field

The present disclosure is directed to the technical field of semiconductor manufacturing, and more particularly, is directed to a semiconductor structure forming method.

Related Art

As semiconductor devices continue to shrink in dimension, a lithographic critical dimension (CD) gradually approaches or exceeds a physical limit of optical lithography, which presents greater challenges for semiconductor manufacturing techniques, particularly lithography. A double patterning (DP) technology also appears timely, and has a basic idea to form a final target pattern by twice patterning, so as to obtain a lithography limit that cannot be achieved by once patterning.

The DP technology currently mainly includes the following three modes: a self-aligned double patterning (SADP) technology, a litho-etching-litho-etch (LELE) DP technology and a Litho-Litho-Etch (LLE) DP technology. Among the three technologies, the LELE technology and the LLE technology require high linearity for photoresist due to twice use of the photoresist, thereby increasing the manufacturing cost and then limiting the application. The SADP technology is particularly suitable for manufacturing semiconductor devices with relatively small lithographic critical dimensions as it only uses the photoresist once and can break through the physical limits of the CD to reduce the minimum pitch to half of the CD.

However, the existing DP technology still needs to be improved.

SUMMARY

The present disclosure provides a semiconductor structure forming method, which addresses the problem on overlay accuracy and further adds a process window, so as to improve the performance of a formed semiconductor structure.

The present disclosure provides a semiconductor structure forming method. In one form, the method includes: providing a base, a first mask layer formed on the base and a second mask layer located at a top of the first mask layer, the second mask layer internally having a first opening, a second opening and a third opening which expose the first mask layer; forming first side wall layers on side walls of the first opening, the second opening and the third opening; forming a first pattern layer filling the first opening, the second opening and the third opening after the first side wall layers are formed, the first pattern layer internally having a first groove that is located right above the second mask layer between the second opening and the third opening; by using the first pattern layer as a mask, etching to remove the second mask layer located between the second opening and the third opening along the bottom of the first groove, so as to form fourth openings located between adjacent first side wall layers; removing the first pattern layer; and by using the second mask layer and the first side wall layers as masks, etching the first mask layer below the first opening, the second opening, the third opening and the fourth openings, so as to form a patterned first mask layer.

Compared with the prior art, a technical solution provided by the present disclosure has the following advantages:

In a technical solution of the semiconductor structure forming method provided by the present disclosure, the second mask layer internally has the first opening, the second opening and the third opening which expose the first mask layer; and the first side wall layers are formed on the side wall of the first opening, the side wall of the second opening and the side wall of the third opening, and occupy a space position. Compared with a solution without the first side wall layers, the process of forming the first opening, the second opening and the third opening in the second mask layer of the present disclosure has a relatively large process window. The method may include: forming the first pattern layer filling the first opening, the second opening and the third opening after the first side wall layers are formed, the first pattern layer internally having the first groove that is located right above the second mask layer between the second opening and the third opening; by using the first pattern layer as a mask, etching to remove the second mask layer located between the second opening and the third opening along the bottom of the first groove, so as to form the fourth openings located between the adjacent first side wall layers; removing the first pattern layer; and by using the second mask layer and the first side wall layers as masks, etching the first mask layer below the first opening, the second opening, the third opening and the fourth openings, so as to form the patterned first mask layer. The first side wall layers are formed on the opposite side walls of the second opening and the third opening, so that the first side wall layers make a process window of forming the first groove relatively large, which is favorable for reducing the process difficulty of forming the first pattern layer; and in addition, the positions of the fourth openings are defined by the first side wall layers, and the first side wall layers have relatively high position accuracy, so that the overlay accuracy of the formed fourth openings is improved.

In some implementations, process steps of forming the first side wall layers include: forming first side wall films at the bottom and the side wall of the first opening, the bottom and the side wall of the second opening, the bottom and the side wall of the third opening, and the top of the second mask layer by adopting an atomic layer depositing process; and back etching the first side wall films by adopting a mask-free etching process, so as to form the first side wall layers. The first side wall films formed by adopting the atomic layer depositing process have good step coverage capacity and thickness uniformity and are favorable for improving the thickness uniformity of the formed first side wall layers, and forming the first side wall layers of good shapes.

DETAILED DESCRIPTION

It can be seen from the background art that the existing double patterning method still needs to be improved.

An analysis finds that a litho-etching-litho-etch (LELE) technology is difficult to apply in a Back End Of Line (BEOL) because of low overlay (OVL) accuracy when a pattern critical dimension of a semiconductor structure becomes smaller.

Therefore, the present disclosure provides a semiconductor structure forming method, which improves the overlay accuracy, enlarges a process window, reduces the process difficulty and improves the performance of a formed semiconductor structure.

In order to make the above-mentioned objectives, features and advantages of the present disclosure more clear, specific embodiments and implementations of the present disclosure are described below in detail in combination with accompanying drawings.

FIG. 1 to FIG. 24 are structural schematic diagrams corresponding to steps in a semiconductor structure forming method.

Figure 1:
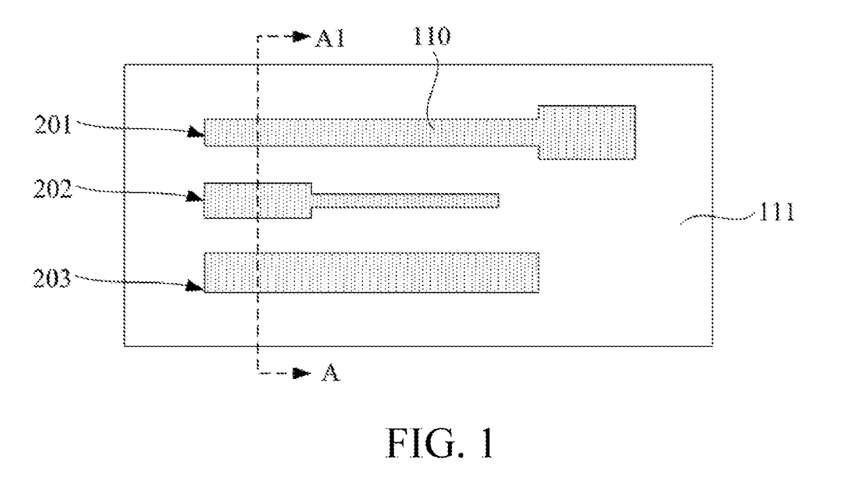
FIG. 1 to FIG. 24 are structural schematic diagrams corresponding to steps in a semiconductor structure forming method.
Figure 2:
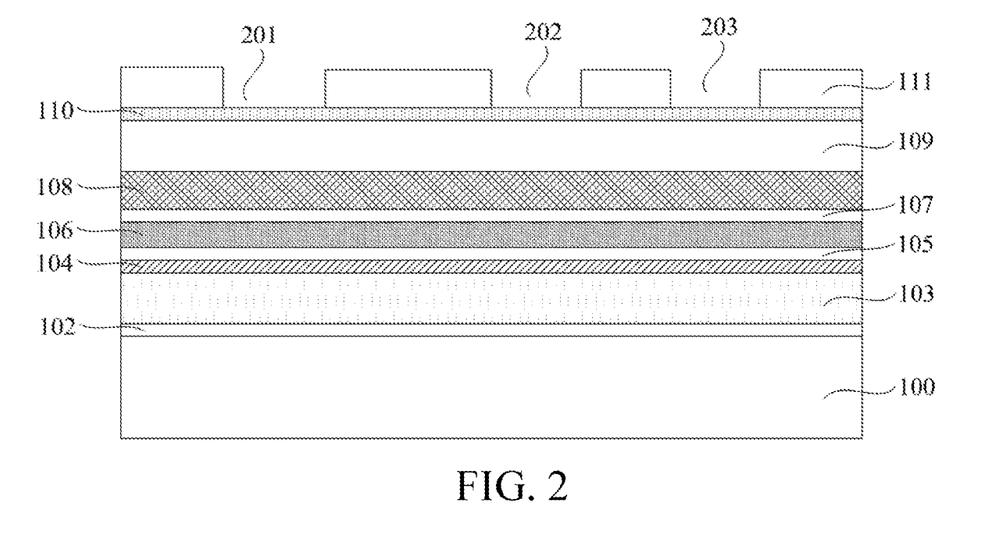
Figure 3:
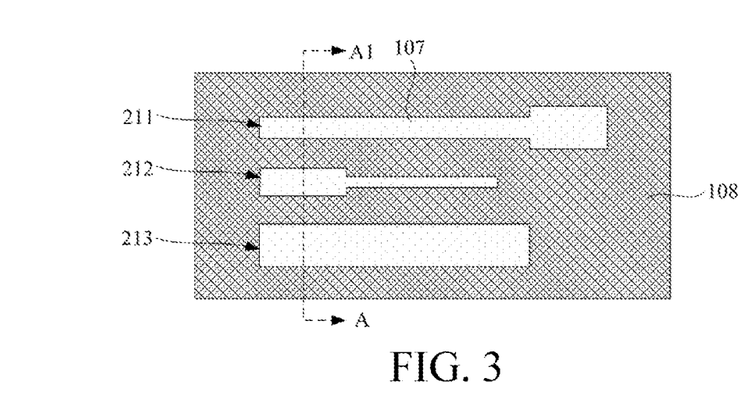
Figure 4:
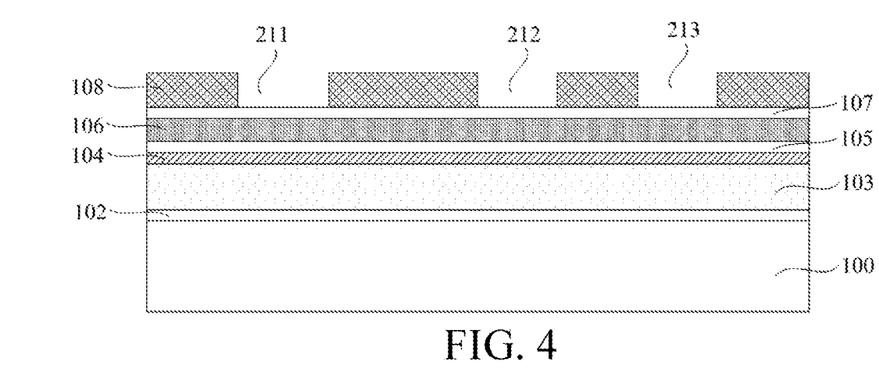

Referring to FIG. 1 to FIG. 4, FIG. 1 and FIG. 3 are top-view structural schematic diagrams; FIG. 2 is a structural schematic diagram of a cross section cut along a cutting line AA1 in FIG. 1; and FIG. 4 is a structural schematic diagram of a cross section cut along a cutting line AA1 in FIG. 3. A base is provided, on which a first mask layer 107 and a second mask layer 108 located at the top of the first mask layer 107 are formed. The second mask layer 108 internally has a first opening 211, a second opening 212 and a third opening 213 which expose the first mask layer 107.

In some implementations, applying the semiconductor structure forming method to the BEOL in a semiconductor manufacturing process is taken for example. The base includes: a substrate 100 and a dielectric layer 103 located on the substrate 100. The substrate 100 internally has a plurality of conductive structures (not shown in the figures). The substrate 100 exposes the surfaces of the conductive structures.

In order to increase the adhesion between the substrate 100 and the dielectric layer 103 and avoid an etching damage to the conductive structures in subsequent etching processes, the base further includes an etching stop layer 102 located between the substrate 100 and the dielectric layer 103, and the etching stop layer 102 and the dielectric layer 103 are made of different materials.

In some implementations, the dielectric layer 103 is made of a low k dielectric material that has a relative dielectric constant less than that of silicon oxide. Correspondingly, a protective layer 104 is further formed on the surface of the dielectric layer 103. In some implementations, the protective layer 104 is made of TEOS.

The first opening 211, the second opening 212 and the third opening 213 are respectively used for defining separate through holes subsequently formed in the dielectric layer 103. The separate through holes respectively expose the top surfaces of the corresponding conductive structures. The first opening 211, the second opening 212 and the third opening 213 are arrayed in parallel along a first direction that is parallel to the cutting line AA1.

In some implementations, in order to improve the shapes of the subsequently formed through holes, a third mask layer 105 located on the base and a fourth mask layer 106 located on the surface of the third mask layer 105 are further included between the base and the first mask layer 107.

The third mask layer 105, the fourth mask layer 106 and the first mask layer 107 form a metal layer-dielectric layer-metal layer superposed mask structure.

The first mask layer 107 is made of a metal compound. For example, the first mask layer 107 is made of TiN or TaN; the third mask layer 105 is made of TiN or TaN; and the fourth mask layer 106 is made of silicon nitride, boron nitride, silicon carbonitride or boron carbonitride.

In some implementations, the third mask layer 105 is made of TiN; the fourth mask layer 106 is made of silicon nitride; and the first mask layer 107 is made of TiN.

The second mask layer 108 and the first mask layer 107 are made of different materials, and the second mask layer 108 is made of a dielectric material. In some implementations, the second mask layer 108 is made of silicon nitride, and the second mask layer 108 has a thickness greater than that of the fourth mask layer 106.

A process step of forming the first opening 211, the second opening 212 and the third opening 213 includes: referring to FIG. 1 and FIG. 2, the second mask layer 108 is formed on the surface of the first mask layer 107, where the second mask layer 108 covers the whole surface of the first mask layer 107; an organic coat layer (ODL) 109 is formed on the surface of the second mask layer 108; an anti-reflection coating layer 110 is formed on the surface of the organic coat layer 109; a photoresist layer 111 is formed on the surface of the anti-reflection coating layer 110, where the photoresist layer 111 internally has a first through hole 201, a second through hole 202 and a third through hole 203; referring to FIG. 3 and FIG. 4, by using the photoresist layer 111 as a mask, the anti-reflection coating layer 110, the organic coat layer 109 and the second mask layer 108 are etched to form the first opening 211, the second opening 212 and the third opening 213; and the photoresist layer 111, the anti-reflection coating layer 110 and the organic coat layer 109 are removed.

A subsequent process step includes: first side wall layers are formed on side walls of the second opening 212 and the third opening 213.

In some implementations, in order to meet a pattern shape requirement, before the first side wall layers are formed, the method further includes: first cutting treatment is performed on the first mask layer 107 located below the first opening 211 along the first direction; and in the first direction, second cutting treatment is performed on the first mask layer 107 below the second mask layer 108 located between the first opening 211 and the second opening 212.

The first cutting treatment and the second cutting treatment are described below in detail in combination of the accompanying drawings.

Figure 5:
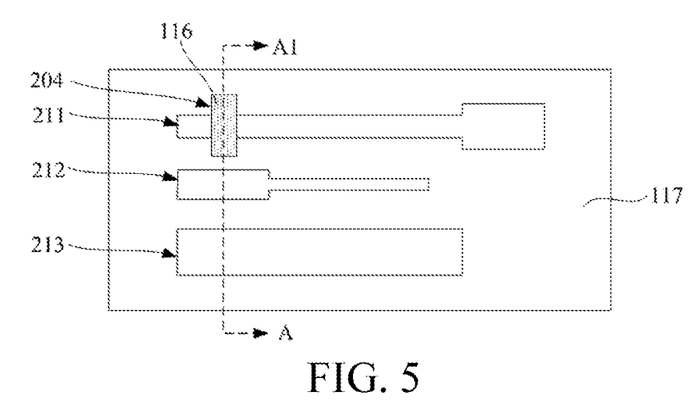
Figure 6:
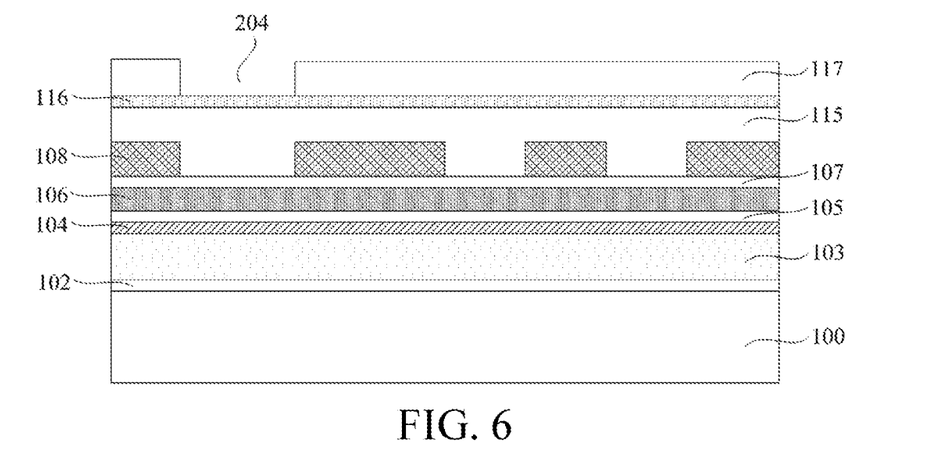

The process step of the first cutting treatment includes:

Referring to FIG. 5 and FIG. 6, a second pattern layer is formed on the first mask layer 107 and the second mask layer 108, where the second pattern layer internally has a second groove 204.

FIG. 5 is a top-view structural schematic diagram, and FIG. 6 is a structural schematic diagram of a cross section cut along the cutting line AA1 in FIG. 5. In order to facilitate the description, FIG. 5 simultaneously shows the first opening 211, the second opening 212, the third opening 213 and the second groove 204.

The process step that the second pattern layer is formed includes: a second organic coat layer 115 filling the first opening 211, the second opening 212 and the third opening 213 is formed; a second anti-reflection coating layer 116 is formed on the surface of the second organic coat layer 115; and a second photoresist layer 117 is formed on the surface of the second anti-reflection coating layer 116, where the second photoresist layer 117 internally has the second groove 204.

In some implementations, a width of the second groove 204 is greater than or equal to that of the first opening 211 along the first direction.

Figure 7:
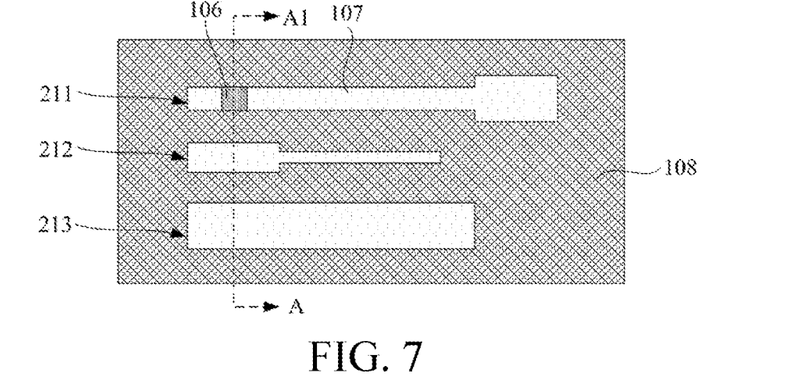
Figure 8:
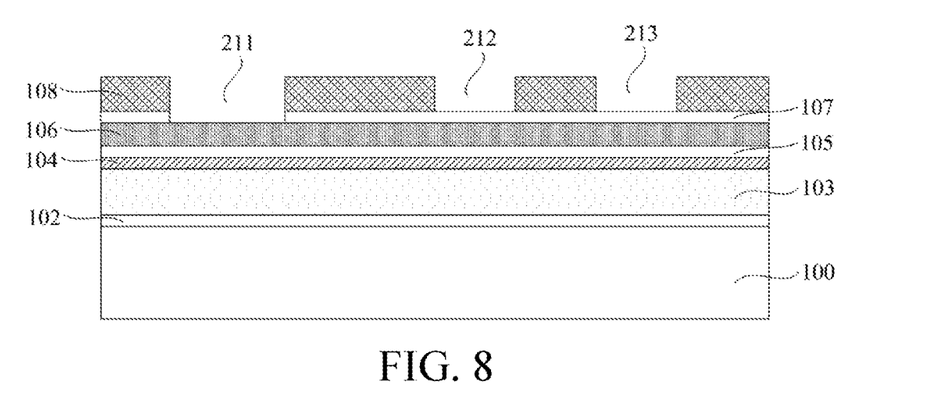

Referring to FIG. 7 and FIG. 8, FIG. 7 is a top-view structural schematic diagram, and FIG. 8 is a structural schematic diagram of a cross section cut along the cutting line AA1 in FIG. 7. By using the second pattern layer as a mask, part of the first mask layer 107, exposed by the first opening 211, is etched to be removed along the bottom of the second groove 204 (referring to FIG. 6), so as to perform the first cutting treatment on the first mask layer 107 below the first opening 211.

In some implementations, the first mask layer 107 located below the second groove 204 and exposed by the first opening 211 is etched to be removed by adopting a dry etching process, so that the first mask layer 107 exposed by the first opening 211 is cut into two parts along a second direction that is perpendicular to the first direction.

After the first cutting treatment is performed, the second pattern layer is removed.

Figure 9:
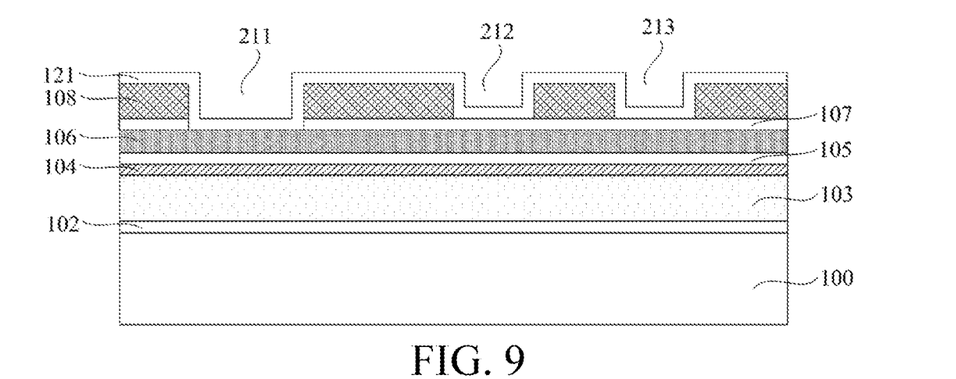

The process step of the second cutting treatment includes:

Referring to FIG. 9, second side wall layers 121 are formed on the side wall of the first opening 211, the side wall of the second opening 212 and the side wall of the third opening 213.

In some implementations, in order to save process steps, the second side wall layers 121 are further located on the top surface of the second mask layer 108 and at the bottom of the first opening 211, the bottom of the second opening 212 and the bottom of the third opening 213.

In order to increase the step coverage capacity of the second side wall layers 121 and improve the thickness uniformity of the second side wall layers 121, the second side wall layers 121 are formed at the bottom and the side wall of the first opening 211, the bottom and the side wall of the second opening 212, the bottom and the side wall of the third opening 213 and the top of the second mask layer 108 by adopting an atomic layer depositing process.

The second side wall layers 121 and the second mask layer 108 are made of different materials. In some implementations, the second side wall layers 121 are made of silicon oxide.

Figure 10:
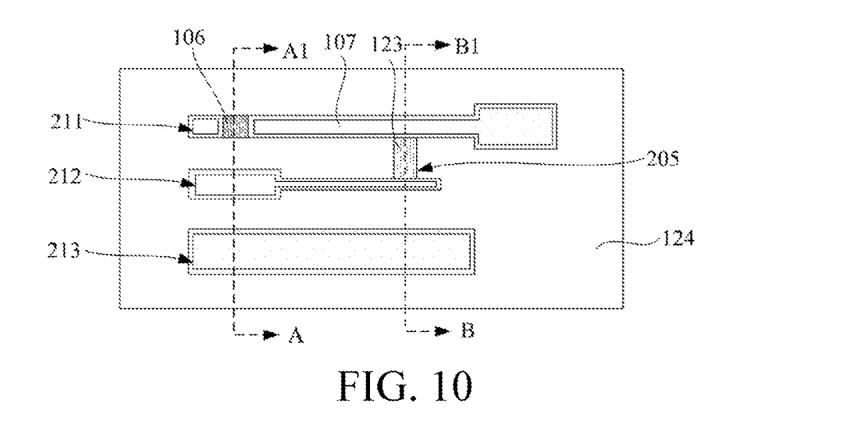
Figure 11:
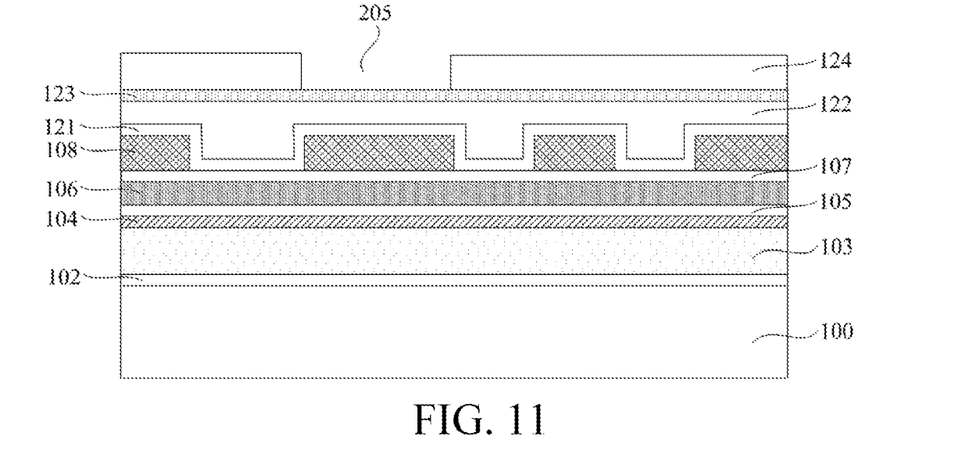

Referring to FIG. 10 and FIG. 11, a third pattern layer filling the first opening 211, the second opening 212 and the third opening 213 is formed on the second side wall layer 121, and internally has a third groove 205.

FIG. 10 is a top-view structural schematic diagram, and FIG. 11 is a structural schematic diagram of a cross section cut along a cutting line BB1 in FIG. 10. It needs to be noted that in order to facilitate illustration and description, FIG. 10 only shows the second side wall layers 121 located on the side wall of the first opening 211, the side wall of the second opening 212 and the side wall of the third opening 213. FIG. 10 also shows the first opening 211, the second opening 212 and the third opening 213. The cutting line BB1 is parallel to the cutting line AA1.

The third pattern layer includes: a third organic coat layer 122 filling the first opening 211, the second opening 212 and the third opening 213; a third anti-reflection coating layer 123 located on the surface of the third organic coat layer 122; and a third photoresist layer 124 located on the surface of the third anti-reflection coating layer 123. The third groove 205 runs through the third photoresist layer 124.

The third groove 205 plays a role of: defining a position to be etched, located below the second mask layer 108 between the first opening 211 and second opening 212, of the first mask layer 107.

Figure 12:
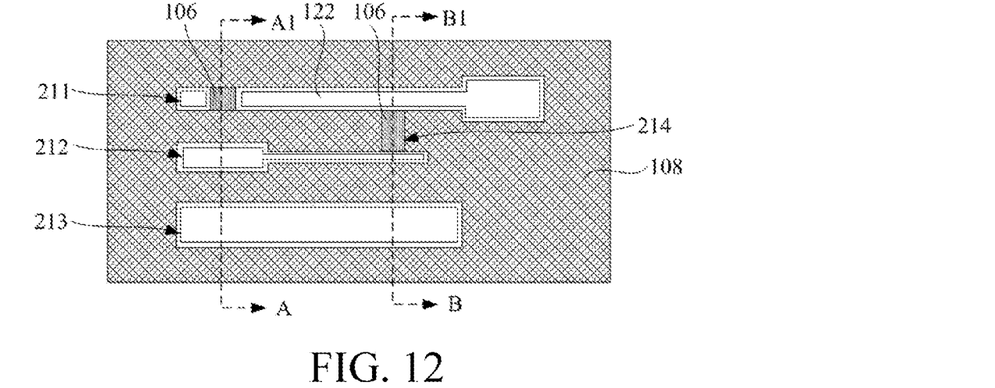
Figure 13:
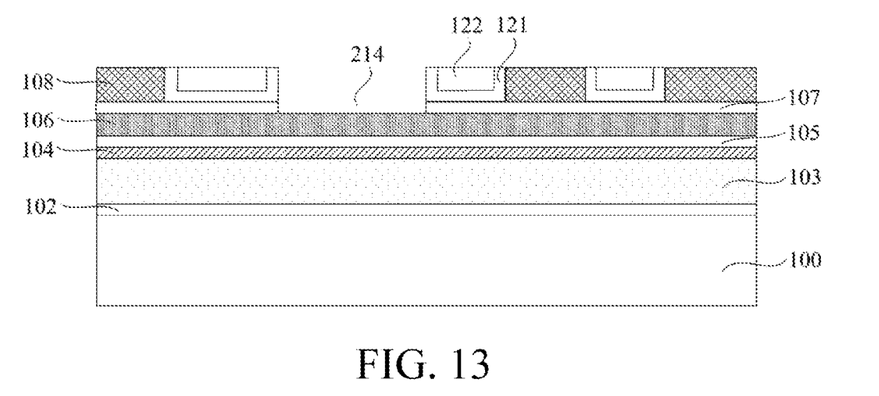

Referring to FIG. 12 and FIG. 13, by using the third pattern layer as a mask, the second mask layer 108 located between the first opening 211 and the second opening 212 and the first mask layer 107 are etched along the third groove 205, so as to perform the second cutting treatment on the first mask layer 107.

FIG. 13 is a structural schematic diagram of a cross section cut along the cutting line BB1 in FIG. 12.

In some implementations, the second cutting treatment is performed on the first mask layer 107, so as to form a fourth opening 214 located between the first opening 211 and the second opening 212 in the first mask layer 107.

The third anti-reflection coating layer 123, the third organic coat layer 122, the second mask layer 108 and the first mask layer 107 which are located at the bottom of the third groove 205 are etched by adopting the dry etching process.

In some implementations, as the second side wall layer 121 is also located on the top surface of the second mask layer 108, correspondingly, the second side wall layer 121 located at the top of the second mask layer 108 also may be etched to be removed.

Figure 14:
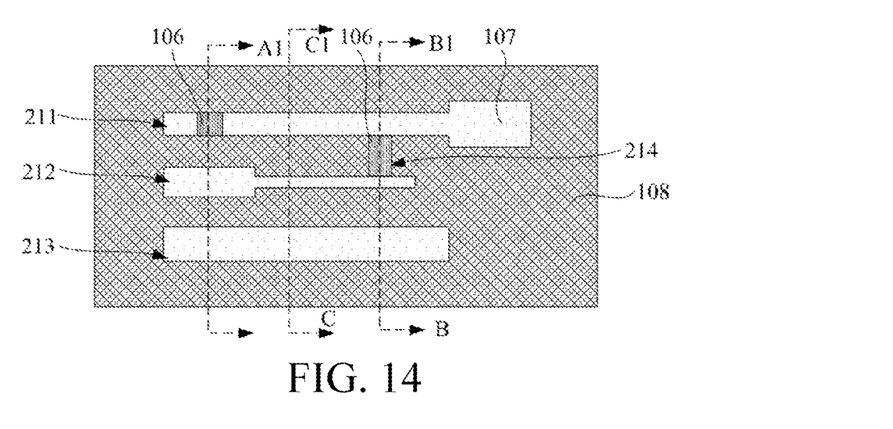
Figure 15:
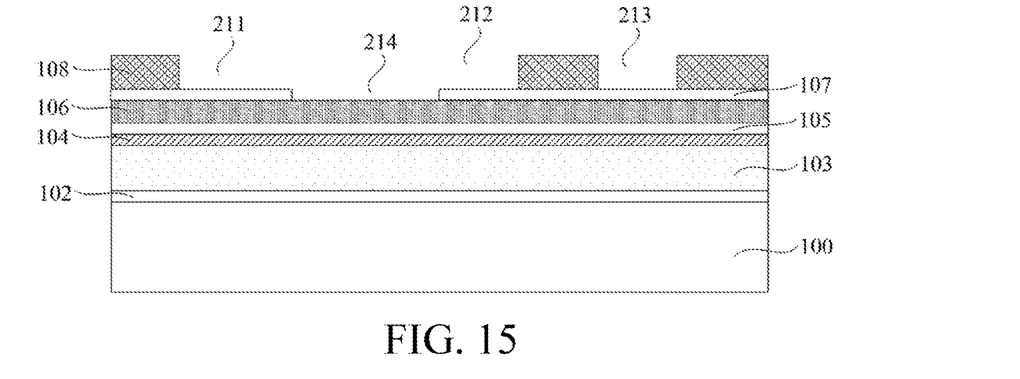
Figure 16:
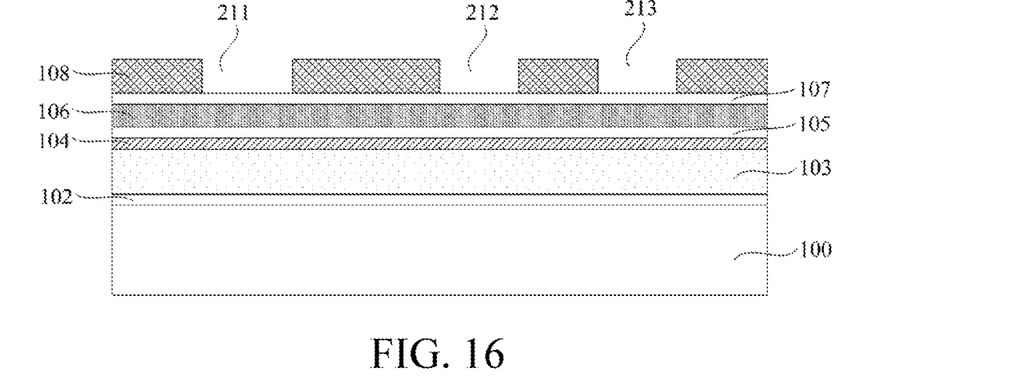

Referring to FIG. 14 to FIG. 16, the third pattern layer is removed, and the second side wall layer 121 (referring to FIG. 13) is removed.

FIG. 14 is a top-view structural schematic diagram; FIG. 15 is a structural schematic diagram of a cross section cut along the cutting line BB1 in FIG. 14; and FIG. 16 is a structural schematic diagram of a cross section cut along a cutting line CC1 in FIG. 14.

In some implementations, after the second cutting treatment, only part of the third organic coat layer 122 (referring to FIG. 13) remains in the third pattern layer, so that the remaining third organic coat layer 122 is removed in the process step that the third pattern layer is removed.

In some implementations, the second side wall layer 121 is etched to be removed by adopting a wet etching process, and etching liquid adopted by the wet etching process is a hydrofluoric acid solution.

It needs to be noted that in some implementations, the first cutting treatment and the second cutting treatment are performed on the first mask layer 107, and in other implementations, neither the first cutting treatment nor the second cutting treatment is performed, or only one of the first cutting treatment and the second cutting treatment is performed.

Figure 17:
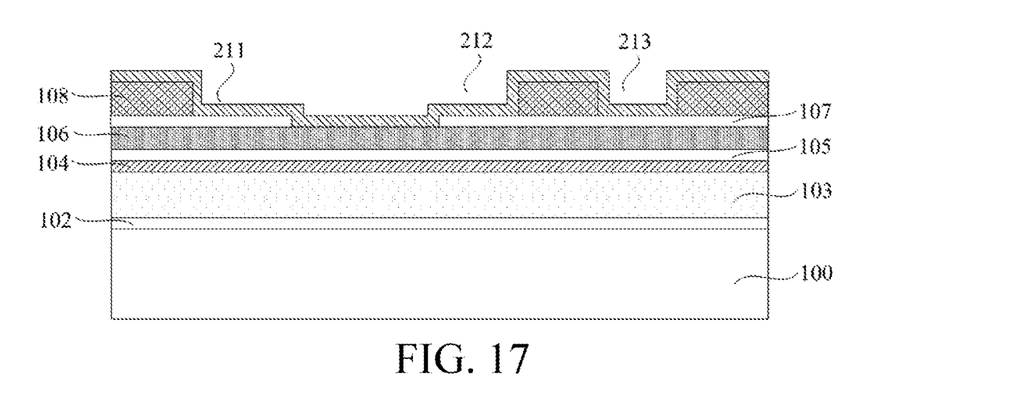
Figure 18:
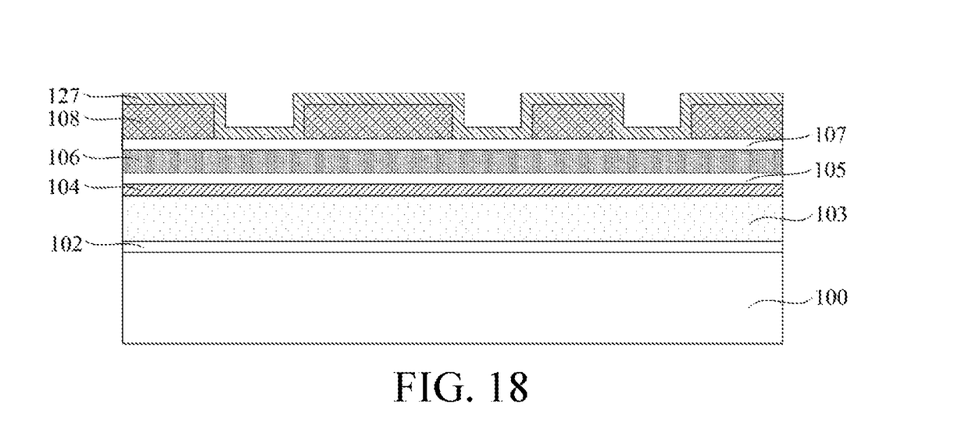
Figure 19:
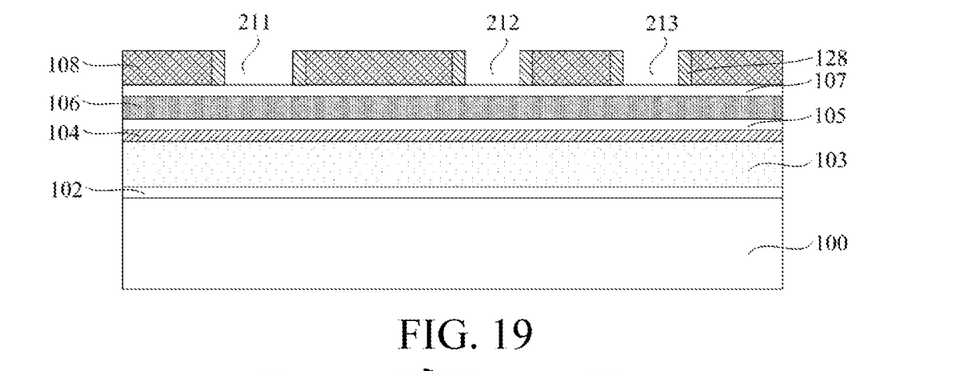

Referring to FIG. 17 to FIG. 19, a subsequent process step includes: first side wall layers 128 are formed on the side walls of the second opening 212 and the third opening 213. The process step that the first side wall layers 128 are formed includes:

referring to FIG. 17 and FIG. 18, FIG. 17 being a structural schematic diagram on the basis of FIG. 15, and FIG. 18 being a structural schematic diagram on the basis of FIG. 16; first side wall films 127 are formed at the bottom and the side wall of the second opening 212, the bottom and the side wall of the third opening 213, the bottom and the side wall of the first opening 211 and the top surface of the second mask layer 108.

The first side wall films 127 provide a process basis for subsequent formation of the first side wall layers.

In some implementations, the first side wall films 127 are formed by adopting the atomic layer depositing process. The first side wall films 127 formed by adopting the atomic layer depositing process is high in thickness uniformity. Furthermore, the first side wall films 127 can well cover a bottom corner of the second opening 212 and a bottom corner of the third opening 213 because of the good step coverage capacity.

The first side wall films 127 and the second mask layer 108 are made of different materials, and the first side wall films 127 and the first mask layer 107 are also made of different materials. In some implementations, the first side wall films 127 are made of silicon oxide. In other implementations, the first side wall films also may be made of silicon nitride, silicon oxynitride or silicon carbonitride.

Referring to FIG. 19 being a structural schematic diagram on the basis of FIG. 18, the first side wall films 127 (referring to FIG. 18) are back etched by adopting a mask layer-free etching process, so as to form the first side wall layers 128.

The mask-free etching process is dry etching. In some implementations, the first side wall films 127 are made of silicon oxide, and etching gas adopted in the dry etching process includes $CF_4$ or $CHF_3$.

In the mask-free etching process, the first side wall film 127 located at the top of the second mask layer 108 is etched to be removed, and the first side wall films 127 located at the bottom of the first opening 211, the bottom of the second opening 212 and the bottom of the third opening 213 are etched to be removed, and only the first side wall films 127 located on the side wall of the first opening 211, the side wall of the second opening 212 and the side wall of the third opening 213 remain, so as to form the first side wall layers 128.

Part of the first side wall layers 128 are independently used as masks subsequently, and the remaining first side wall layers 128 and the second mask layer 108 form a mask together.

As the first side wall layers 128 are formed by adopting the mask-free etching process, the width ranges of the first side wall layers 128 are not affected by a lithography process. Therefore, the widths of the first side wall layers 128 can be made very small, and the first side wall layers 128 still have high position accuracy and shape accuracy, so as to avoid the problem of an overlay error caused by the existing lithography process.

In some implementations, the width ranges of the first side wall layers 128 are 10 nm to 15 nm, such as 12 nm, 13 nm and 14 nm.

Figure 20:
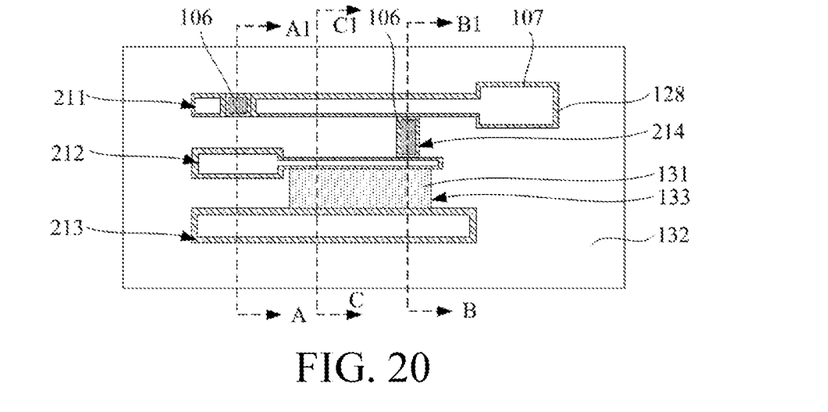
Figure 21:
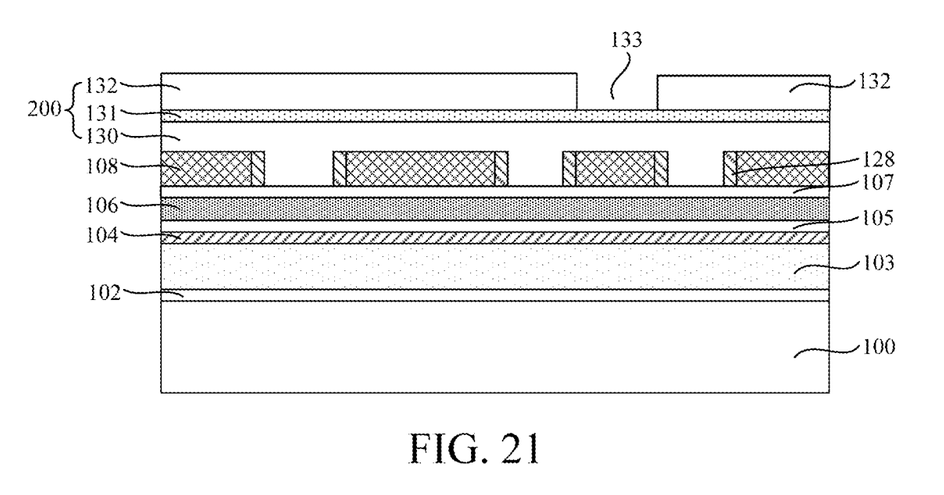

Referring to FIG. 20 and FIG. 21, after the first side wall layers 128 are formed, a first pattern layer 200 filling the first opening 211, the second opening 212 and the third opening 213 is formed. The first pattern layer 200 internally has a first groove 133. The first groove 133 is located right above the second mask layer 108 between the second opening 212 and the third opening 213.

FIG. 20 is a top-view structural schematic diagram, and FIG. 21 is a structural schematic diagram of a cross section cut along the cutting line CC1 in FIG. 20.

The first pattern layer 200 plays a role that: by using the first pattern layer 200 as a mask subsequently, the second mask layer 108 located between the second opening 212 and the third opening 213 is etched to be removed along the first groove 133.

In some implementations, the first opening 211, the second opening 212, the third opening 213 and the first groove 133 are arrayed in parallel along the first direction. A positive projection of the first groove 133 on the second mask layer 108 is located between the second opening 212 and the third opening 213.

As the first side wall layers 128 are formed on the opposite side walls of the second opening 212 and the third opening 213, and the first side wall layers 128 having certain widths provide a relatively large process window for the first groove 133 of the first pattern layer, so that a width of the first groove 133 is greater than or equal to a width between the first side wall layer 128 on the side wall of the second opening 212 and the first side wall layer 128 on the side wall of the adjacent third opening 213, and the width of the first groove 133 is less than the width between the side wall of the second opening 212 and the side wall of the adjacent third opening 213.

Therefore, even if the side wall of the first groove 133 is located above the first side wall layer 128 on the side wall of the second opening 212, and the side wall of the first groove 133 is located above the first side wall layer 128 on the side wall of the third opening 213, the position of the first groove 133 still meets a process requirement. That is to say, in some implementations, a relatively large process window is provided for the formation of the first pattern layer.

Furthermore, as the first side wall layers 128 are formed on the side wall of the first opening 211, the side wall of the second opening 212 and the side wall of the third opening 213, after the first side wall layers 128 are formed, the width dimension of the first opening 211, the width dimension of the second opening 212 and the width dimension of the third opening 213 are all smaller than those before the first side wall layers 128 are formed, and after the first side wall layers 128 are formed, the first opening 211, the second opening 212 and the third opening 213 which have the reduced width dimensions are used for defining a target pattern to be formed. Therefore, in some implementations, the lithography process window in the process step that the second mask layer 108 having the first opening 211, the second opening 212 and the third opening 213 is formed is large, so that the production difficulty is reduced, and the position accuracy and the shape accuracy of the first opening 211, the second opening 212 and the third opening 213 are improved.

The process step that the first pattern layer 200 is formed includes: a first organic coat layer 130 filling the first opening 211, the second opening 212 and the third opening 213 is formed, where the top of the organic coat layer 130 is higher than that of the second mask layer 108; a first anti-reflection coating layer 131 is formed on the surface of the first organic coat layer 130; and a first photoresist layer 132 is formed on the surface of the first anti-reflection coating layer 131, where the first groove 133 running through the first photoresist layer 132 is formed in the first photoresist layer 132.

Figure 22:
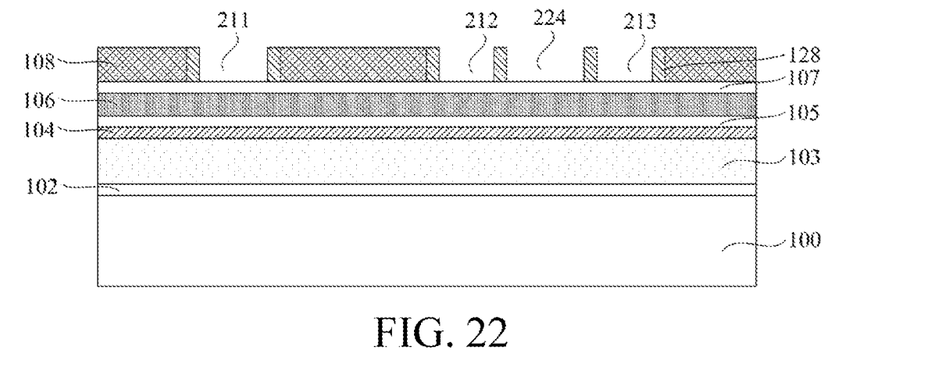

Referring to FIG. 22, by using the first pattern layer 200 (referring to FIG. 21) as a mask, the second mask layer 108 located between the second opening 212 and the third opening 213 is etched to be removed along the bottom of the first groove 133 (referring to FIG. 21), so as to form fourth openings 224 located between adjacent first side wall layers 128.

Specifically, by using the first photoresist layer 132 as a mask, the first anti-reflection coating layer 131, the first organic coat layer 130 and the second mask layer 108 are etched along the first groove 133 till the surface of the first mask layer 107 is exposed.

In some implementations, the second mask layer 108 is etched by adopting the dry etching process. In order to avoid an unnecessary etching damage to the first side wall layers 128, the dry etching process is high in etching selection ratio of the second mask layer 108 to the first side wall layers 128. In some implementations, the etching selection ratio of the second mask layer 108 to the first side wall layers 128 in the dry etching process is greater than or equal to 10, so that the first side wall layers 128 still may keep good shapes after the second mask layer 108 located between the second opening 212 and the third opening 213 is etched to be removed.

The first pattern layer is removed after the surface of the first mask layer 107 is exposed.

Figure 23:
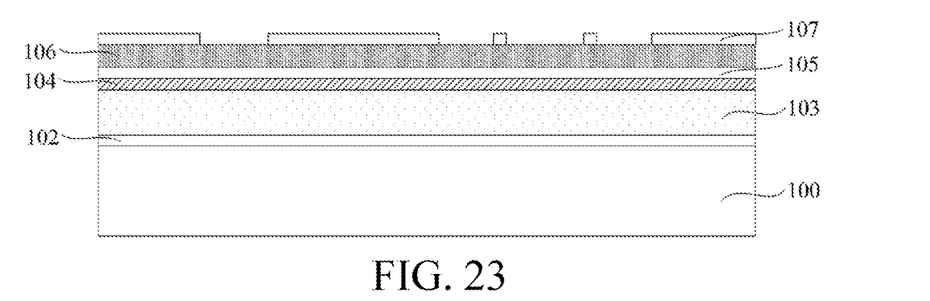

Referring to FIG. 23, after the first pattern layer is removed, by using the second mask layer 108 (referring to FIG. 22) and the first side wall layers 128 (referring to FIG. 22) as masks, the first mask layer 107 below the first opening 211, the second opening 212, the third opening 213 and the fourth openings 224 is etched, so as to form a patterned first mask layer 107.

Patterns of the first opening 211, the second opening 212, the third opening 213 and the fourth openings 224 are transmitted into the first mask layer 107, so as to form a patterned first mask layer 107.

The fourth openings 224 are defined by the first side wall layers 128, and the width dimensions of the first side wall layers 128 are not limited by the lithography process, so that the first side wall layers 128 have high position accuracy, which correspondingly allows the formed fourth openings 224 to have high position accuracy as well.

The first mask layer 107 is etched by adopting the dry etching process. In some implementations, the etching selection ratio of the first mask layer 107 to the second mask layer 108 in the dry etching process is greater than or equal to 10.

The second mask layer 108 and the first side wall layers 128 are removed after the fourth openings 224 are formed. In some implementations, the second mask layer 108 and the first side wall layers 128 are etched to be removed by adopting the wet etching process.

Figure 24:
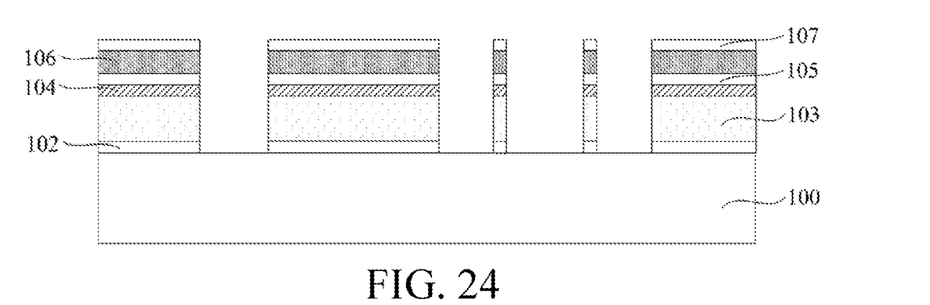

Referring to FIG. 24, by using the patterned first mask layer 107 as a mask, the dielectric layer 103 is etched, so as to form multiple through holes (not shown) that expose the conductive structures.

Specifically, by using the patterned first mask layer 107 as a mask, the fourth mask layer 106 and the third mask layer 105 are etched, so as to expose the surface of the protective layer 104; and then the protective layer 104, the dielectric layer 103 and the etching stop layer 102 are etched till the surfaces of the conductive structures are exposed.

In some implementations, the dielectric layer 103 is etched by adopting the dry etching process.

It will be appreciated that according to the foregoing analysis, the patterned first mask layer 107 has high position accuracy, and correspondingly, the through holes formed in the dielectric layer 103 also have high position accuracy, which is favorable for improving the performance of the formed semiconductor structure.

A subsequent process step includes: conductive layers filling the through holes are formed.

In the technical solution of the semiconductor structure forming method provided by embodiments and implementations of the present disclosure, the second mask layer 108 internally has the first opening 211, the second opening 212 and the third opening 213 exposing the first mask layer 107; the first side wall layers 128 are formed on the side walls of the first opening 211, the second opening 212 and the third opening 213; the first pattern layer filling the first opening 211, the second opening 212 and the third opening 213 is formed, and internally has the first groove 133; and the first groove 133 is located right above the second mask layer 108 between the second opening 212 and the third opening 213. The first side wall layers 128 are formed on the side walls of the second opening 212 and the third opening 213, so that compared with a solution without the first side wall layers, the present disclosure has the advantage that the process of forming the first opening 211, the second opening 212 and the third opening 213 in the second mask layer 108 has a relatively large process window.

The first side wall layers 128 are formed on the opposite side walls of both the second opening 212 and the third opening 213, so that the first side wall layers 128 make a process window of forming the first groove 133 relatively large, which is favorable for reducing the process difficulty of forming the first pattern layer; and in addition, the positions of the fourth openings 224 are defined by the first side wall layers 128, and the first side wall layers 128 have relatively high position accuracy, so that the overlay accuracy of the formed fourth openings 224 is improved. Correspondingly, the formed patterned first mask layer 107 also has relatively high position accuracy after the patterns of the first opening 211, the second opening 212, the third opening 213 and the fourth openings 214 are transmitted to the first mask layer 107.

Although the present disclosure has been disclosed as above, the present disclosure is not limited thereto. Any changes and modifications may be made by those skilled in the art without departing from the spirit and scope of the present disclosure, and the projection scope of the present disclosure should be subject to the scope defined by the claims.

What is claimed is:

1. A patterning method, comprising:
providing a base, a first mask layer formed on the base, and a second mask layer located at a top of the first mask layer, the second mask layer internally having a first opening, a second opening and a third opening which expose the first mask layer, the first opening, the second opening, the third opening being arrayed in parallel along a first direction;
performing a first cutting treatment on the first mask layer located below the first opening along the first direction;
after performing the first cutting treatment, performing a second cutting treatment on the first mask layer below the second mask layer located between the first opening and the second opening along the first direction;
after performing the second cutting treatment, forming first side wall layers on a side wall of the first opening, a side wall of the second opening and a side wall of the third opening;
forming a first pattern layer filling the first opening, the second opening and the third opening after the first side wall layers are formed, the first pattern layer internally having a first groove that is located right above the second mask layer between the second opening and the third opening;
etching, using the first pattern layer as a mask, to remove the second mask layer located between the second opening and the third opening along the bottom of the first groove, so as to form fourth openings located between adjacent first side wall layers; removing the first pattern layer; and
etching, using the second mask layer and the first side wall layers as masks, the first mask layer below the first opening, the second opening, the third opening and the fourth openings, so as to form a patterned first mask layer.

2. The patterning method according to claim 1, wherein:
the first groove is arrayed in parallel along a first direction; and
a positive projection of the first groove on the second mask layer is located between the second opening and the third opening.

3. The patterning method according to claim 2, wherein:
a width of the first groove is greater than or equal to a width between the first side wall layer on the side wall of the second opening and the first side wall layer on the side wall of the adjacent third opening along the first direction, and
the width of the first groove is less than a width between the side wall of the first opening and the side wall of the adjacent second opening.

4. The patterning method according to claim 1, wherein:
the second mask layer located between the second opening and the third opening is etched to be removed by adopting a dry etching process; and
an etching selection ratio of the second mask layer to the first side wall layers in the dry etching process is greater than or equal to 10.

5. The patterning method according to claim 1, wherein:
the first side wall layers and the first mask layer are made of different materials; and
the first side wall layers and the second mask layer are made of different materials.

6. The patterning method according to claim 5, wherein the first side wall layers are made of silicon oxide, silicon nitride or silicon oxynitride.

7. The patterning method according to claim 1, wherein the first side wall layers have a width range of 10 nm to 15 nm.

8. The patterning method according to claim 1, wherein the process step of forming the first side wall layers comprises:
forming first side wall films at the bottom and the side wall of the first opening, the bottom and the side wall of the second opening, the bottom and the side wall of the third opening, and the top of the second mask layer; and
back etching the first side wall films by adopting a mask-free etching process, so as to form the first side wall layers.

9. The patterning method according to claim 8, wherein the first side wall films are formed by adopting an atomic layer depositing process.

10. The patterning method according to claim 1, wherein the first pattern layer comprises:
a first organic coat layer filling the first opening, the second opening and the third opening;
a first anti-reflection coating layer located on the surface of the first organic coat layer; and
a first photoresist layer located on the surface of the first anti-reflection coating layer, the first photoresist layer internally having the first groove running through the first photoresist layer.

11. The patterning method according to claim 1, wherein the first mask layer is made of a metal compound, and the second mask layer is made of a dielectric material.

12. The patterning method according to claim 11, wherein the first mask layer is made of TiN or TaN, and the second mask layer is made of silicon oxide, silicon nitride, silicon oxynitride or silicon carbonitride.

13. The patterning method according to claim 1, wherein process steps adopted in the first cutting treatment comprise:
forming a second pattern layer on the first mask layer and the second mask layer, the second pattern layer internally having a second groove; and
etching, using the second pattern layer as a mask, to remove part of the first mask layer, exposed by the first opening, along the second groove, so as to perform the first cutting treatment on the first mask layer below the first opening.

14. The patterning method according to claim 1, wherein process steps adopted in the second cutting treatment comprise:
forming second side wall layers on the side wall of the first opening, the side wall of the second opening and the side wall of the third opening;
forming a third pattern layer filling the first opening, the second opening and the third opening on the second side wall layers, the third pattern layer internally having a third groove;
etching, using the third pattern layer as a mask, the second mask layer located between the first opening and the second opening and the first mask layer along the third groove, so as to perform the second cutting treatment on the first mask layer;
removing the third pattern layer; and
removing the second side wall layers.

15. The patterning method according to claim 14, wherein the second side wall layers are formed at the bottom and the side wall of the first opening, the bottom and the side wall of the second opening, the bottom and the side wall of the third opening, and the top of the second mask layer by adopting an atomic layer depositing process.

16. The patterning method according to claim 1, wherein:
a third mask layer is located on the base and a fourth mask layer is located between the first mask layer and the third mask layer; and
the method further comprises: after the patterned first mask layer is formed, etching, using the patterned first mask layer as a mask, the fourth mask layer to form a patterned fourth mask layer; and by using the patterned fourth mask layer as a mask, etching the third mask layer to form a patterned third mask layer.

17. The patterning method according to claim 16, wherein the third mask layer is made of TiN or TaN, and the fourth mask layer is made of silicon nitride, boron nitride, silicon carbonitride or boron carbonitride.

18. The patterning method according to claim 1, wherein: the base comprises:
a substrate and a dielectric layer located on the substrate; and
a plurality of conductive structures formed in the substrate; and
the method further comprises:
after the patterned first mask layer is formed, etching, using the patterned first mask layer as a mask, the dielectric layer, so as to form multiple through holes exposing the conductive structures; and forming conductive layers filling the through holes.

\* \* \* \* \*